United States Patent
Akram et al.

[11] Patent Number: 6,114,240
[45] Date of Patent: Sep. 5, 2000

[54] METHOD FOR FABRICATING SEMICONDUCTOR COMPONENTS USING FOCUSED LASER BEAM

[75] Inventors: Salman Akram, Boise; Warren M. Farnworth, Nampa; Alan G. Wood, Boise, all of Id.

[73] Assignee: Micron Technology, Inc., Boise, Id.

[21] Appl. No.: 09/250,289

[22] Filed: Feb. 12, 1999

Related U.S. Application Data

[63] Continuation-in-part of application No. 08/993,965, Dec. 18, 1997.

[51] Int. Cl.$^7$ .................................................. H01L 21/44
[52] U.S. Cl. ........................... 438/667; 438/666; 438/672
[58] Field of Search .................................. 438/666, 667, 438/672; 264/482, 155, 156

[56] References Cited

U.S. PATENT DOCUMENTS

| | | | |
|---|---|---|---|
| 5,046,239 | 9/1991 | Miller et al. | 29/852 |
| 5,063,177 | 11/1991 | Geller et al. | 437/209 |
| 5,166,097 | 11/1992 | Tanielian | 437/203 |
| 5,172,050 | 12/1992 | Swapp | 324/158 P |
| 5,229,647 | 7/1993 | Gnadinger | 257/785 |
| 5,236,551 | 8/1993 | Pan | 156/643 |
| 5,249,450 | 10/1993 | Wood et al. | 72/359 |
| 5,420,520 | 5/1995 | Anschel et al. | 324/754 |
| 5,426,072 | 6/1995 | Finnila . | |
| 5,483,741 | 1/1996 | Akram et al. | 29/846 |
| 5,487,999 | 1/1996 | Farnworth et al. | 437/7 |
| 5,495,667 | 3/1996 | Farnworth et al. | 29/843 |
| 5,528,080 | 6/1996 | Goldstein . | |
| 5,541,525 | 7/1996 | Wood et al. | 324/755 |
| 5,559,444 | 9/1996 | Farnworth et al. | 324/754 |
| 5,578,526 | 11/1996 | Akram et al. | 437/209 |
| 5,592,736 | 1/1997 | Akram et al. | 29/842 |
| 5,607,818 | 3/1997 | Akram et al. | 430/311 |
| 5,634,267 | 6/1997 | Farnworth et al. | 29/840 |
| 5,674,785 | 10/1997 | Akram et al. | 437/217 |
| 5,686,317 | 11/1997 | Akram et al. | 437/8 |
| 5,716,218 | 2/1998 | Farnworth et al. . | |
| 5,756,395 | 5/1998 | Rostoker | 438/622 |
| 5,781,022 | 7/1998 | Wood et al. . | |
| 5,783,461 | 7/1998 | Hembree . | |
| 5,796,264 | 8/1998 | Farnworth et al. | 324/758 |
| 5,801,452 | 9/1998 | Farnworth et al. . | |
| 5,815,000 | 9/1998 | Farnworth et al. . | |
| 5,834,945 | 12/1996 | Akram . | |
| 5,869,974 | 2/1999 | Akram et al. . | |
| 5,878,485 | 3/1999 | Wood et al. . | |
| 5,896,036 | 4/1999 | Wood et al. . | |
| 5,915,977 | 6/1999 | Hembree et al. . | |
| 5,929,647 | 7/1999 | Akram et al. . | |
| 5,931,685 | 8/1999 | Hembree et al. . | |

FOREIGN PATENT DOCUMENTS

| WO 95/14314 | 5/1995 | WIPO | H01R 9/00 |
|---|---|---|---|

OTHER PUBLICATIONS

"Forming Electrical Interconnections Through Semiconductor Wafers", T. R. Anthony, American Institute of Physics, 1981, p. 5340–5349.

T. R. Anthony, "Forming Electrical Interconnections Through Semiconductor Wafers", American Institute of Physics, 1981, p. 5340–5349.

*Primary Examiner*—Charles Bowers
*Assistant Examiner*—Nema Berezny
*Attorney, Agent, or Firm*—Stephen A. Graton

[57] ABSTRACT

A method for fabricating semiconductor components, such as packages, interconnects and test carriers, is provided. The method includes laser machining conductive vias for interconnecting contacts on the component, using a laser beam that is focused to produce a desired via geometry. The vias can include enlarged end portions to facilitate deposition of a conductive material during formation of the vias, and to provide an increased surface area for forming the contacts. For example, by focusing the laser beam at a midpoint of a substrate of the component, an hour glass via geometry is provided. Alternately, the laser beam can be focused at an exit point, or at an entry point of the substrate, to provide converging or diverging via geometries. The method can also include forming contact pins on the conductive vias by bonding and shaping metal wires using a wire bonding process, or a welding process.

28 Claims, 5 Drawing Sheets

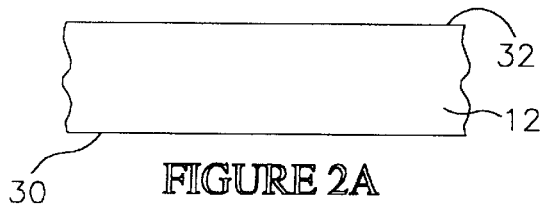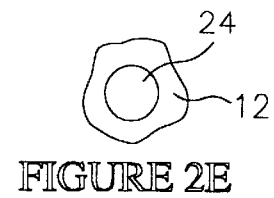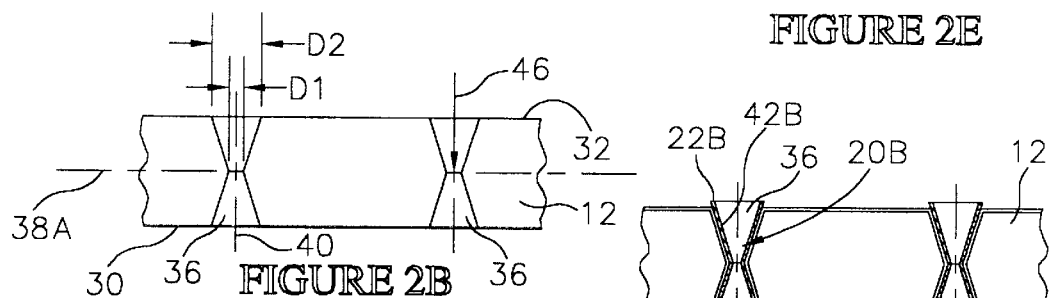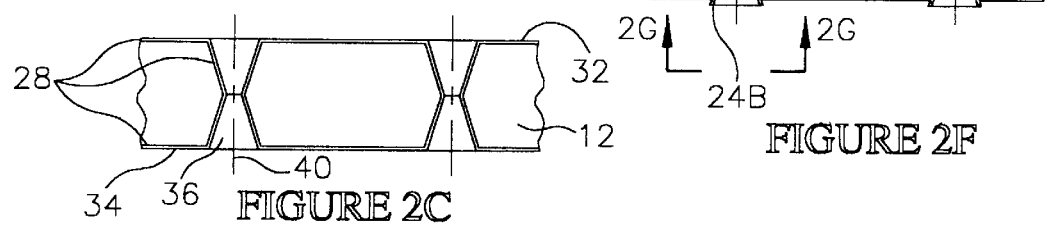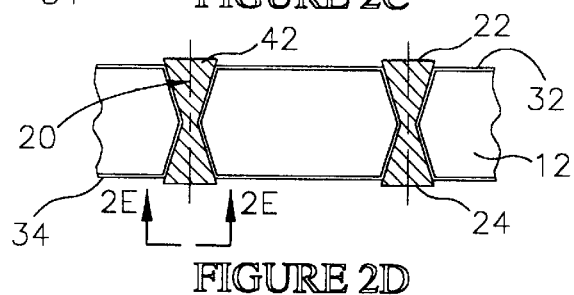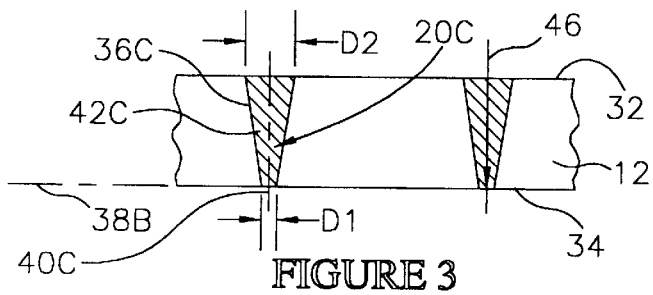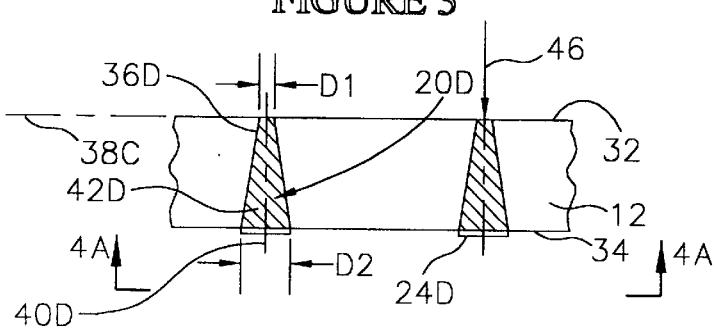

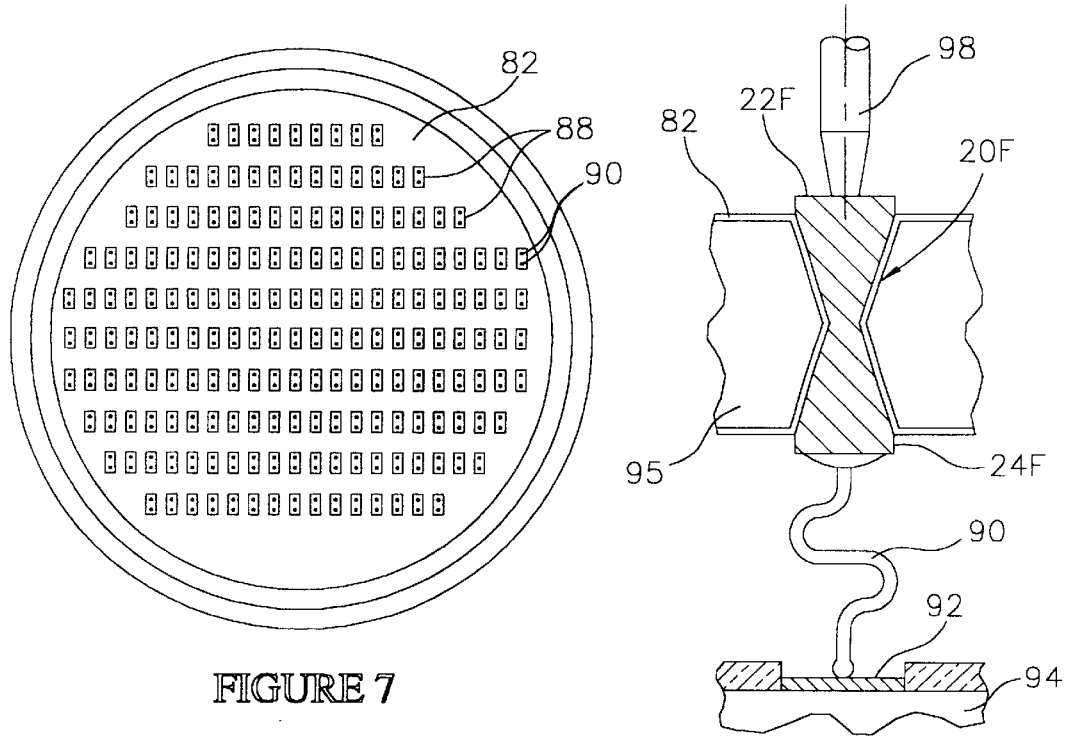
FIGURE 7
FIGURE 8B
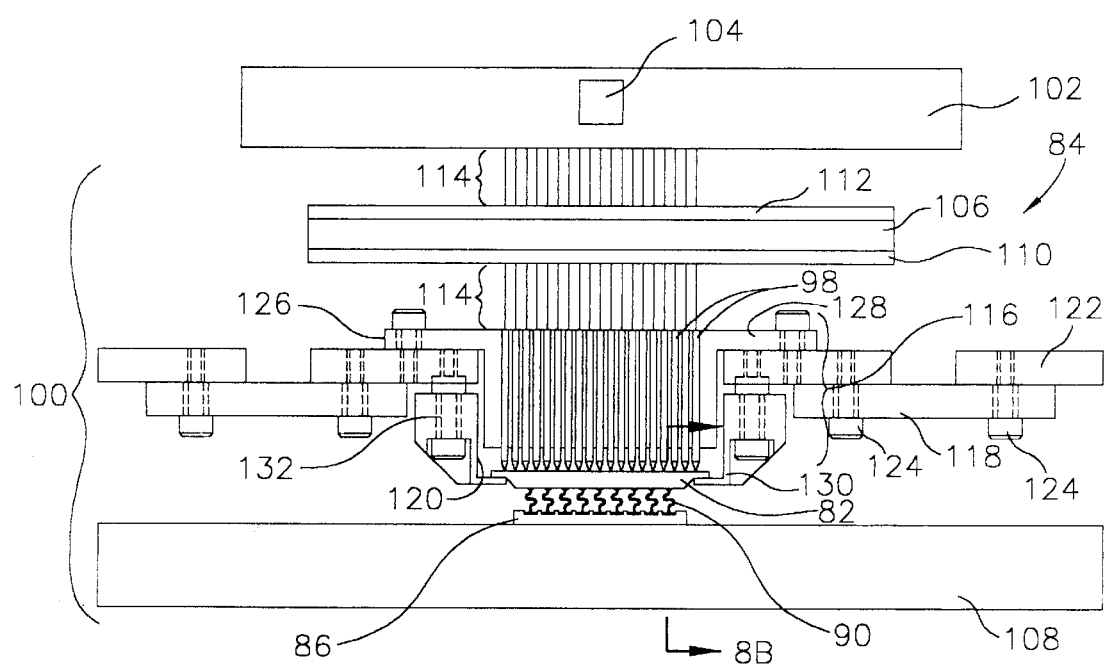
FIGURE 8A

METHOD FOR FABRICATING SEMICONDUCTOR COMPONENTS USING FOCUSED LASER BEAM

CROSS REFERENCE TO RELATED APPLICATIONS

This application is a continuation-in-part of application Ser. No. 08/993,965 filed Dec. 18, 1997 entitled "Semiconductor Interconnect Having Laser Machined Contacts".

FIELD OF THE INVENTION

This invention relates generally to semiconductor manufacture, and specifically to a method for fabricating semiconductor components such as packages, interconnects, and test carriers, using a focused laser.

BACKGROUND OF THE INVENTION

As used herein, the term "semiconductor component" refers to an electronic component that includes a semiconductor die, or that makes electrical connections to a semiconductor die. Exemplary semiconductor components include semiconductor packages, multi chip modules, wafers, interconnects, and test carriers for testing dice and packages.

Conventional semiconductor components include external contacts that allow electrical connections to be made from the outside to the integrated circuits contained in the component. For example, semiconductor packages can include external contacts such as solder balls, formed in a ball grid array (BGA) on a substrate of the component.

Besides the external contacts, semiconductor components can also include internal contacts formed on different surfaces of the substrates than the external contacts. For example, semiconductor packages can include bond pads for wire bonding to the dice contained in the packages. Typically, the bond pads are located on a first surface of the package, and the external contacts are located on a second surface of the package. As another example, test carriers for testing semiconductor components, such as bare dice, and chip scale packages, include internal contacts for making temporary electrical connections to the external contacts on components being tested. In addition, the test carriers include external contacts such as pins or balls for making electrical connections to a test board and test circuitry.

With each component electrical paths must be provided through the component, for electrically interconnecting the external contacts to the internal contacts. One method for providing the electrical paths is by forming vias between the contacts, and then filling the vias with a conductive material. For component substrates formed of an etchable material, such as silicon or ceramic, the vias are typically etched in the substrate using a wet or dry etchant. For substrates formed of plastic, such as a glass filled resin (e.g., FR-4), the vias are typically molded, or machined in the substrate.

One problem with interconnecting contacts on semiconductor components is that with advances in semiconductor manufacture, the size and spacing of the contacts is decreasing, and the total number of contacts on a single component is increasing. A chip scale package, for example, can include a hundred, or more, external contacts each having a diameter of only about 10 mils, and a pitch of only about 30 mils.

Interconnecting small, densely spaced, contacts on semiconductor components requires small, densely spaced conductive vias. Because of their small size it can be difficult to fill the vias with a conductive material. Also because of the required size and spacing of the contacts, complex electrical paths must sometimes be provided through the component. Signal delays and high resistivity can result from complex electrical paths.

Furthermore, the conductive vias must sometimes be electrically connected to the contacts using a bonding technique, such as soldering, or wire bonding. The small size of the contacts and vias makes the bonding process difficult. For example, bonding solder balls to metal filled vias can be made difficult by the small size of the solder balls and vias. In a similar manner wire bonding to metal filled vias can be difficult.

The present invention is directed to an improved method for fabricating semiconductor components with small, closely spaced contacts.

SUMMARY OF THE INVENTION

In accordance with the present invention, an improved method for fabricating semiconductor components is provided. Also provided are improved semiconductor components fabricated using the method, including packages, interconnects and test carriers.

The method, simply stated, comprises laser machining conductive vias for interconnecting contacts on a component, using a laser beam that is focused to produce a desired via geometry. An hour glass geometry is produced by focusing the laser beam proximate to a midpoint of the via. The hour glass geometry includes enlarged end portions having increased surface areas for depositing a conductive material into the via, and for forming contacts on the via. An inwardly tapered geometry is produced by focusing the laser beam proximate to an exit point of the beam from the substrate. An outwardly tapered geometry is produced by focusing the laser beam proximate to an entry point of the beam into the substrate.

Following laser machining, the via is at least partially filled with a conductive material such as a metal or conductive polymer. In addition, the conductive material can include contacts on either end, or the contacts can "fan out" on a surface of the substrate. In addition, external contacts such as balls or pins, can be formed on the contacts using a bonding technique such as wire bonding, soldering or adhesive bonding.

In a first embodiment of the method, a semiconductor package is fabricated. The package includes a substrate, and a semiconductor die flip chip mounted to the substrate. The substrate includes conductive vias having first contacts on a first surface of the substrate, and second contacts on a second opposing surface of the substrate. Bumped bond pads on the die are bonded to the first contacts, and contact balls for making outside electrical connections to the package are bonded to the second contacts.

In a second embodiment of the method, a test carrier for testing semiconductor components, such as chip scale packages and bare dice, is provided. The carrier comprises a base, conductive vias in the base, and first and second contacts on either side of the conductive vias for making temporary electrical connections between a component under test, and test circuitry of a test apparatus (e.g., burn-in board). The first contacts on the conductive vias comprise conductive pockets for electrically engaging external contacts (e.g., solder balls) on the component under test. The second contacts on the conductive vias comprise pads, and contact pins are bonded to the pads, for electrically engage mating electrical connectors on the test apparatus.

In a third embodiment of the method, an interconnect for testing a semiconductor wafer is fabricated. The interconnect includes a substrate, conductive vias in the substrate, and first and second contacts on either side of the conductive vias for making temporary electrical connections between the wafer and test circuitry. Contact pins are bonded to the first contacts, and are adapted to electrically engage bond pads on dice contained on the wafer. The contact pins comprise wires bonded to the first contacts, and formed in a compliant shape, such as a spring segment.

The second contacts on the interconnect comprise pads for electrically engaging spring loaded electrical connectors (e.g., POGO PINS) of the test circuitry.

The method of the invention, generally stated, includes the steps of: providing a substrate for a component having a first surface and a second surface; laser machining an opening in substrate from the first surface to the second surface using a laser beam; selecting a focal point of the laser beam to form the opening with at least one enlarged end portion; depositing a conductive material through the enlarged end portion into the opening to form a conductive via; and forming a contact on the enlarged end portion.

BRIEF DESCRIPTION OF THE DRAWINGS

FIGS. 2A–2D are schematic cross sectional views illustrating process steps for fabricating the conductive vias for the package shown in FIGS. 1A–1D;

FIG. 2E is a bottom view of the conductive via taken along section line 2E—2E of FIG. 2D illustrating a contact thereon;

FIG. 2F is a schematic cross sectional view of an alternate embodiment conductive via;

FIG. 2G is a bottom view of the alternate embodiment conductive via taken along section line 2G—2G of FIG. 2F illustrating an alternate embodiment contact thereon;

FIG. 3 is a schematic cross sectional view illustrating alternate embodiment conductive vias;

FIG. 4 is a schematic cross sectional view illustrating alternate embodiment conductive vias;

FIG. 4A is a bottom view of the alternate embodiment conductive vias taken along section line 4A—4A of FIG. 4;

FIG. 7 is a schematic plan view of an interconnect constructed in accordance with the invention for testing dice contained on a wafer;

FIG. 8A is a schematic side elevation view of a system for testing semiconductor wafers constructed using the interconnect of FIG. 7; and FIG. 8B is an enlarged schematic cross sectional view taken along section line 8B—8B of FIG. 8A.

DETAILED DESCRIPTION OF THE PREFERRED EMBODIMENT

Figure 1A:
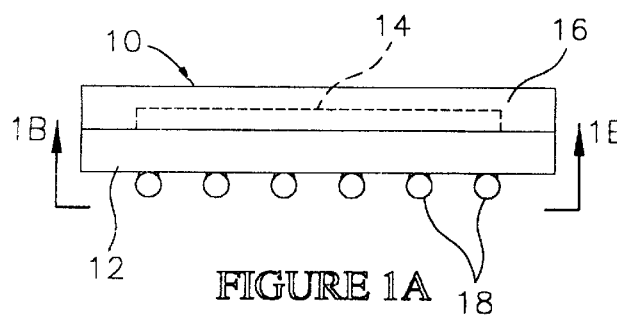
FIG. 1A is a side elevation view of a semiconductor package constructed in accordance with the invention.
Figure 1B:
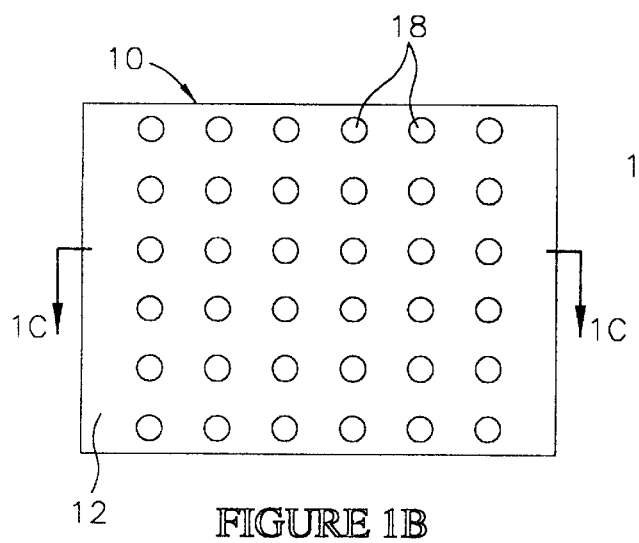
FIG. 1B is a bottom view of the package taken along section line 1B—1B of FIG. 1A.

Referring to FIGS. 1A–1D, a semiconductor package 10 constructed in accordance with the method of the invention is illustrated. The package 10 includes a substrate 12, a semiconductor die 14 flip chip mounted to the substrate 12, and an encapsulant 16 covering the die 14, and face of the substrate 12.

The package 10 also includes conductive vias 20 formed within the substrate 12 using a laser machining process to be hereinafter described. The conductive vias 20 include first contacts in the form of ball bonding contacts 24 (FIG. 1D) for bonding contact balls 18 to the substrate 12. The contact balls 18 function as external contacts for the package 10, and permit the package 10 to be surface mounted to a mating component such as a circuit board or multi chip module. The conductive vias 20 also include second contacts in the form of die bonding contacts 22 (FIG. 1C) for flip chip bonding the die 14 to the substrate 12. The die 14 includes bumped bond pads 26 (FIG. 1C) configured for bonding to the die bonding contacts 22 using a suitable process such as solder reflow.

In the illustrative embodiment, the substrate 12 comprises a semiconductor material such as monocrystalline silicon, germanium, silicon-on-glass, or silicon-on-sapphire. In other embodiments to be subsequently described, the substrate 12 can comprise a ceramic, a plastic, or a glass filled resin material (e.g., FR-4). In addition, the substrate 12 includes an electrically insulating layer 28 (FIG. 1D), such as $SiO_2$ or polyimide, formed on exposed surfaces thereof, and within the conductive vias 20, to provide electrical insulation. If the substrate 12 is formed of an electrically insulating material, such as ceramic or plastic, the insulating layer 28 can be eliminated.

The encapsulant 16 can comprise an epoxy, silicone, room temperature vulcanizing (RTV), or polyimide material. Suitable encapsulants are commercially available from Dexter/Hysol under the trademark "HYSOL 4450", and from Thermoset under the trademark of "EP-729. The encapsulant 16 can be formed by dispensing a viscous encapsulant into a mold placed over the substrate 12, and then curing the viscous material.

Figure 1C:
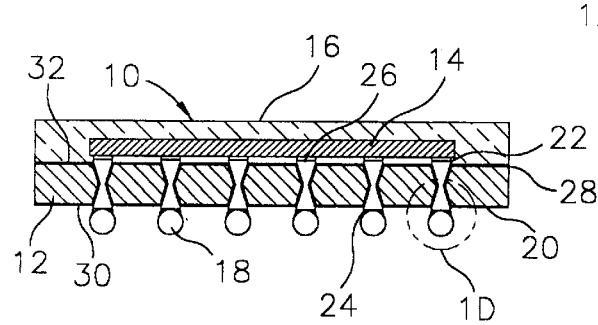
FIG. 1C is a cross sectional view of the package taken along section line 1C—1C of FIG. 1B.
Figure 1D:
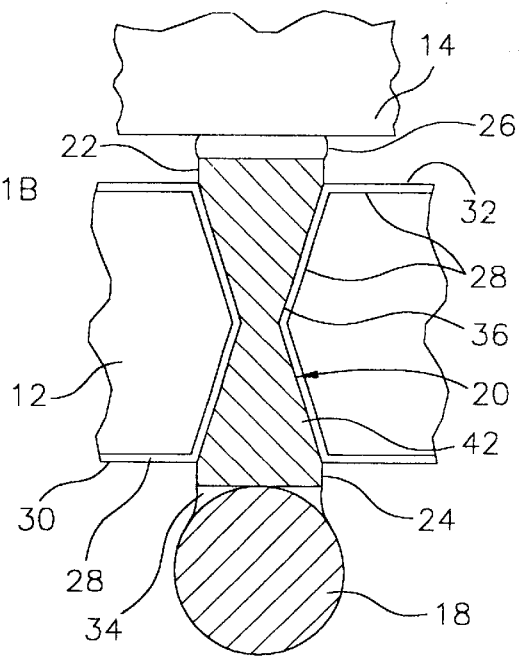
FIG. 1D is an enlarged view of a portion of FIG. 1C taken along section line 1D showing a conductive via and contacts on the conductive via.

As shown in FIG. 1D, the substrate 12 includes an outer surface 30 wherein the contact balls 18 are located, and an opposing inner surface 32 wherein the die 14 is located. The conductive vias 20 comprise laser machined openings 36 extending from the outer surface 30 to the inner surface 32 of the substrate 12. Each laser machined opening 36 is at least partially filled with a conductive material 42, such as a metal or a conductive polymer.

Also, each laser machined opening 36 has an hour glass shape (i.e., converging-diverging shape). The hour glass shape provides enlarged openings at either end for depositing the conductive material 42 within the opening 36 during formation of the conductive via 20. The hour glass shape also provides increased surface areas at either end for forming the ball bonding contacts 24 and the die bonding contacts 22. In addition, the increased surface areas facilitate bonding of the contact balls 18 to the ball bonding contacts 24, and facilitate bonding of the bumped bond pads 26 to the die bonding contacts 22.

For reflow applications, the contact balls 18 can comprise a solder alloy such as 95%Pb/5%Sn, 60%Pb/40%Sn, 63%In/37%Sn, or 62%Pb/36%Sn/2%Ag. Alternately, the contact balls 18 can comprise a relatively hard metal such as nickel, copper, beryllium copper, alloys of nickel, alloys of copper, alloys of beryllium copper, nickel-cobalt-iron alloys and iron-nickel alloys. The contact balls 18 can also comprise a base metal and an outer layer formed of a non-oxidizing metal such as gold, silver, copper or palladium. In addition, the contact balls 18 can comprise a conductive polymer such as an isotropic or anisotropic adhesive.

One method for attaching the contact balls 18 to the ball bonding contacts 24 is by bonding pre-fabricated metal balls to the ball bonding contacts 24. For example, pre-fabricated metal balls are manufactured by Mitsui Comtek Corp. of Saratoga, Calif. under the trademark "SENJU SPARKLE BALLS". The metal balls can be attached to the ball bonding contacts 24 by soldering, laser reflow, brazing, welding, or applying a conductive adhesive. In the illustrative embodiment, solder fillets 34 (FIG. 1D) attach the contact balls 18 to the ball bonding contacts 24.

A solder ball bumper can also be used to bond the contact balls 18 to the ball bonding contacts 22. A suitable solder ball bumper is manufactured by Pac Tech Packaging Technologies of Falkensee, Germany. The contact balls 18 can also be formed on the ball bonding contacts 22 using a conventional wire bonder apparatus adapted to form a ball bond, and then to sever the attached wire. The contact balls 18 can also be formed by electrolytic deposition or electroless deposition of a metal to form bumps.

In the illustrative embodiment, the ball bonding contacts 24 and the die bonding contacts 22 are raised pads formed of a same material as the conductive material 42. Alternately the ball bonding contacts 24 and the die bonding contacts 22 can comprise a different material than the conductive material 42. For example, the conductive material 42 can comprise an easily deposited material such as nickel, whereas the ball bonding contacts 24 can comprise a solderable material such as copper to facilitate bonding of the contact balls 18. Also, rather than being raised pads, the ball bonding contacts 24 and the die bonding contacts 22 can be planar to the outer surface 30 and to the inner surface 32 of the substrate 12.

Figure 1E:
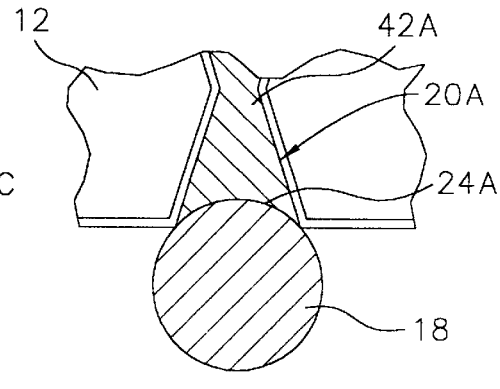
FIG. 1E is an enlarged view equivalent to FIG. 1D of an alternate embodiment conductive via.

Referring to FIG. 1E, an alternate embodiment conductive via 20A comprises a conductive material 42A, in the form of a conductive polymer, such as an isotropic or anisotropic adhesive, deposited within the laser machined opening 36. The conductive via 20A includes a ball bonding contact 24A in the form of a concave depression sized and shaped to retain the contact ball 18. The ball bonding contact 24A can be formed by depositing the conductive material 42A in a viscous state into the laser machined opening 36, and then curing the conductive material 42A with the contact ball 18 pressed into the conductive material 42A.

Figure 1F:
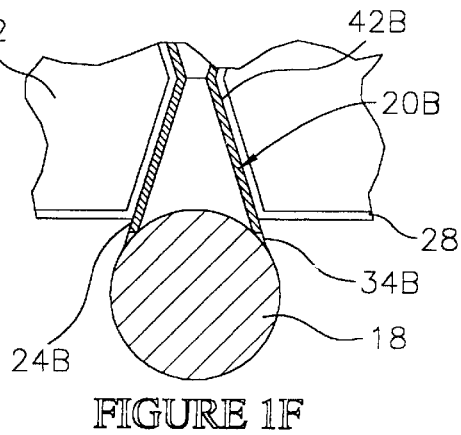
FIG. 1F is an enlarged view equivalent to FIG. 1D of an alternate embodiment conductive via.

Referring to FIG. 1F, an alternate embodiment conductive via 20B comprises a conductive layer 42B formed on a sidewall of the laser machined opening 36. In addition, a ball bonding pad 24B of the conductive via 20B comprises a peripheral lip sized and shaped to retain the contact ball 18. Solder fillets 34B bond the contact ball 18 to the ball bonding pad 24A.

Referring to FIGS. 2A–2F, steps in a method for fabricating the conductive vias 20 (FIG. 2D) are illustrated.

Initially, as shown in FIG. 2A, the substrate 12 can be provided. Preferably, a wafer of material is provided such that multiple substrates 12 can be fabricated using semiconductor circuit fabrication techniques, and then singulated by cutting the wafer. Such a process is referred to as a wafer level fabrication process. In the illustrative embodiment the substrate 12 comprises a semiconductor material, but can also comprise ceramic, plastic or glass filled resin as previously described.

The substrate 12 includes the outer surface 30 and the opposing inner surface 32, which are generally planar and parallel to one another. A representative thickness of the substrate 12, measured from the outer surface 30 to the inner surface 32, can be from about 12 mils to 38 mils.

Next, as shown in FIG. 2B, the laser machined openings 36 are formed in the substrate 12 using a laser beam 46. The laser machined openings 36 have longitudinal axes 40, and extend through the full thickness of the substrate 12 from the inner surface 32 to the outer surface 30 thereof. A suitable laser machining apparatus for forming the openings 36 is manufactured by General Scanning of Sommerville, Mass. and is designated a Model No. 670-W. Another suitable laser machining apparatus for forming the openings 36 is manufactured by Synova S.A., Lausanne, Switzerland.

A representative diameter of the openings 36 can be from 10 $\mu$m to 2 mils or greater. A representative fluence of the laser beam 46 suitable for forming the openings 36 through a substrate 12 comprising silicon and having a thickness of about 28 mils is from 2 to 10 watts/per opening at a pulse duration of 20–25 ns and at a repetition rate of up to several thousand per second. The wavelength of the laser beam 46 can be a standard infrared or green wavelength (e.g., 1064 nm–532 nm), or any wavelength that will interact with and heat silicon.

For forming the openings 36 with an hour glass shape a focal plane 38A of the laser beam 46 can be located along a mid-point of the substrate 12. This forms the openings 36 with a diameter D1 at the focal plane 38A of the laser beam 46. In addition, the openings 36 have a diameter D2 at the inner surface 32 where the laser beam enters the substrate 12, and also have a diameter D2 at the outer surface 30 where the laser beam 46 exits the substrate 12. The diameter D2 is greater than D1 and provides enlarged areas at the ends of the openings 36 for depositing the conductive material 42 (FIG. 2D) into the openings 36. In addition, the enlarged diameter D2 provides increased surface areas for the die bonding contacts 22 (FIG. 2D), and for the ball bonding contacts 24 (FIG. 2D).

Following formation of the openings 36, and as shown in FIG. 2C, the insulating layers 28 can be formed within the openings 36, and on the outer surface 30 and inner surface 32 of the substrate 12. The insulating layers 28 can comprise an insulating material, such as $SiO_2$, or $Si_3N_4$, deposited to a desired thickness using CVD, or other deposition process. A $SiO_2$ layer can also be grown on exposed surfaces of the substrate 12 using an oxidizing atmosphere such as steam and $O_2$ at an elevated temperature (e.g., 950° C.). The insulating layers 28 can also comprise an insulating polymer, such as polyimide, deposited and planarized using a suitable process (e.g., spin-on-process). In the case of an insulating polymer, a spin on process can be used to deposit the polymer on the outer surface 30 and the inner surface 32 of the substrate 12. Alternately, an injection or capillary process can be used to deposit the polymer layer into the openings 36. Depending on the material, a representative thickness of the insulating layer 28 can be from about a 100 Å to several mils.

Following formation of the insulating layer 28, and as shown in FIG. 2D, the conductive material 42 can be deposited into the openings 36. The conductive material 42 can comprise a metal, such as solder, aluminum, titanium, nickel, iridium, copper, gold, tungsten, silver, platinum, palladium, tantalum, molybdenum, or alloys of these metals. The metal can be deposited within the openings 36 using a deposition process, such as CVD, electrolytic deposition or electroless deposition. Alternately, a solder alloy can be screen printed into the openings 36, or injected by capillary action, or with a vacuum system using a hot solder wave. In addition, the conductive material 42 can comprise plugs that completely fill the openings 36, or alternately as shown in FIG. 2F, can comprise layers 42B that cover just the inside surfaces or sidewalls of the openings 36.

Also, rather than being a metal, the conductive material 42 can comprise a conductive polymer (43A-FIG. 1E), such as a metal filled silicone, a carbon filled ink, or an isotropic or anisotropic adhesive. Suitable conductive polymers are sold by A.I. Technology, Trenton, N.J.; Sheldahl, Northfield, Minn.; 3M, St. Paul, Minn. A conductive polymer can be deposited within the openings 36, as a viscous material, and then cured as required. A suitable deposition process, such as screen printing, or stenciling, can be used to deposit the conductive polymer into the openings 36.

As shown in FIG. 2D, the die bonding contacts 22 and the ball bonding contacts 24 can comprise a same material as the conductive material 42 and can be formed using the same deposition process. In the illustrative embodiment, the die bonding contacts 22 and ball bonding contacts 24 are pads which project from the inner surface 32 and the outer surface 34 respectively of the substrate 12. A suitable mask (not shown) can be used during deposition of the conductive material 42 to form the die bonding contacts 22 and ball bonding contacts 24 with a desired thickness and peripheral shape. Alternately, the die bonding contacts 22 and the ball bonding contacts 24 can comprise a different material than the conductive material 42 formed using a separate deposition or metallization process. For example, the die bonding contacts 22 and ball bonding contacts 24 can comprise a wire bondable or solderable metal such as copper or aluminum, while the conductive material can comprise a material such as nickel.

As shown in FIG. 2E, a representative peripheral shape for the ball bonding contact 24 (and also for the die bonding contacts 22) can be generally circular. However, other peripheral shapes such as square, rectangular, or polygonal can also be employed. As shown in FIG. 2G, with the conductive material 42B comprising a thin layer on the sidewalls of the opening 36, the ball bonding contact 24B (and also the die bonding contacts 22B) comprises a circular ridge. In this configuration, the ball bonding contacts 24B can be sized and shaped to retain the contact balls 18 and to facilitate the bonding process for the contact balls 18.

Referring to FIG. 3, an alternate embodiment conductive via 20C comprises a laser machined opening 36C filled with a conductive material 42C. In this embodiment the laser machined opening 36C is inwardly tapered (i.e., converging) along a longitudinal axis 40C of the opening 36C. Stated differently, the diameter D1 of the opening 36C proximate to the outer surface 30 of the substrate 12 is smaller than the diameter D2 of the opening 36C proximate to the inner surface 32 of the substrate 12. The inwardly tapered laser machined opening 42C can be made by focusing the laser beam 46 along a focal plane 38B that is co-planar to the outer surface 30 of the substrate 12, and co-planar to the exit point of the laser beam 16 from the substrate 12.

Referring to FIG. 4, an alternate embodiment conductive via 20D comprises a laser machined opening 36D filled with a conductive material 42D. In this embodiment the laser machined opening 36D is outwardly tapered (i.e., diverging) along a longitudinal axis 40D of the opening 36D. Stated differently, the diameter D1 of the opening 36D proximate to the inner surface 32 of the substrate 12 is smaller than the diameter D2 of the opening 36D proximate to the outer surface 30 of the substrate 12. The outwardly tapered laser machined opening 42D can be made by focusing the laser beam 46 along a focal plane 38C that is co-planar to the inner surface 32 of the substrate 12, and co-planar to the entry point of the laser beam into the substrate 12.

As shown in FIG. 4A, the conductive vias 20D also include ball bonding contacts 24D in a "fan out" configuration. Specifically, the axes 40D (FIG. 4) of the conductive vias 20D are offset from a center line (or axis) of the ball bonding contacts 24D. In addition, the conductive vias 20D are formed in an alternating pattern on opposite sides of adjacent ball bonding contacts 24D.

This permits a pitch P1 of the conductive vias 20D to match the pitch of the bumped bond pads 26 (FIG. 1C) on the die 14 (FIG. 1C). However, a pitch P2 of the ball bonding contacts 24D can be double the pitch P1 (P2=2×P1) of the conductive vias 20D. This arrangement permits an increased pitch P2 for bonding the contact balls 18 (FIG. 1D) to the ball bonding contacts 24D. As also shown in FIG. 4A, conductors 44 can be provided on the outer surface 30 of the substrate 12 to form electrical paths between the conductive vias 20D and the ball bonding contacts 24D.

Figures 5A, 5B, 5C:
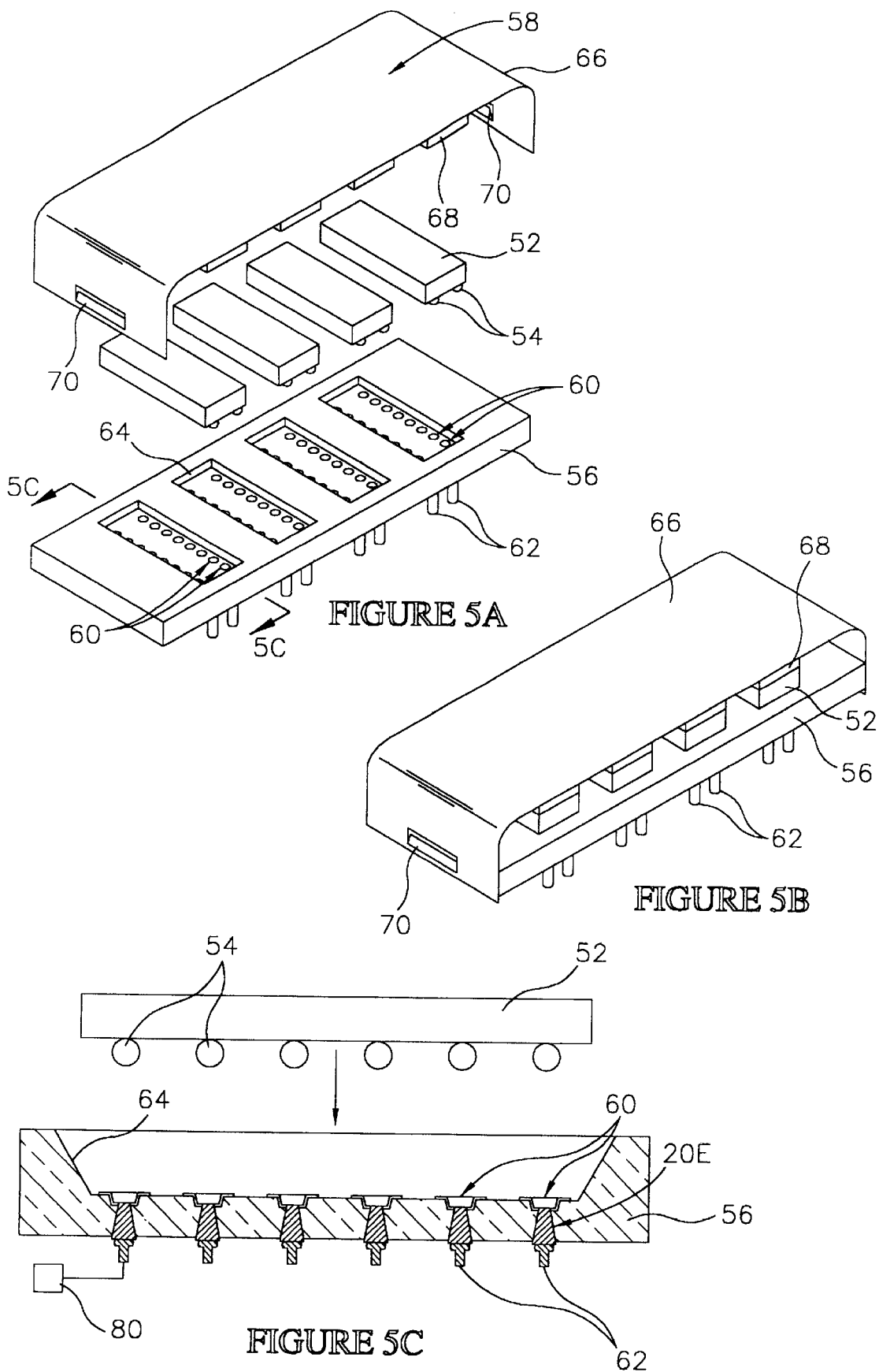
FIG. 5A is an exploded schematic perspective view of a test carrier constructed in accordance with the invention.
FIG. 5B is a schematic perspective view of the assembled test carrier of FIG. 5A.
FIG. 5C is an enlarged schematic cross sectional view taken along section line 5C—5C of FIG. 5A.

Referring to FIGS. 5A–5C, a test carrier 50 constructed in accordance with an alternate embodiment of the invention is illustrated. The test carrier 50 is adapted to temporarily package semiconductor components 52 for test and burn-in. The semiconductor components 52 can comprise either bare dice, or chip scale packages. The semiconductor components 52 include external contacts 54, such as solder balls, in electrical communication with the integrated circuits contained on the components 52.

The test carrier 50 includes a base 56 and a force applying mechanism 58. The base 56 includes test contacts 60 adapted to make temporary electrical connections with the external contacts 54 on the components 52. In addition, the base 56 includes contact pins 62 adapted to electrically engage mating electrical connectors (not shown) on a test apparatus such as a burn-in board. The base 56 also includes conductive vias 20E (FIG. 5C) which electrically connect the test contacts 60 to the external contacts 54. The test contacts 60 and conductive vias 20E are fabricated using the laser machining method to be hereinafter described.

The base 56 also includes a plurality of alignment members 64 adapted to align the external contacts 54 on the components 52, to the test contacts 60 on the base 56. In the illustrative embodiment the alignment members 64 comprise openings in the base 56 configured to contact the peripheral edges of the components 52 to guide the components 52 onto the test contacts 60. Alternately the alignment members 64 can comprise separate components, such as silicon plates, as described in U.S. Pat. No. 5,559,444, entitled "METHOD AND APPARATUS FOR TESTING UNPACKAGED SEMICONDUCTOR DICE", incorporated herein by reference. As another alternative, the alignment members 64 can be eliminated and the components 52 can be aligned with the test contacts 60 using an optical alignment technique. Such an optical alignment technique is described in U.S. Pat. No. 5,796,264, entitled "APPARA- TUS FOR MANUFACTURING KNOWN GOOD SEMICONDUCTOR DICE", which is incorporated herein by reference.

In the illustrative embodiment, the base 56 comprises molded plastic formed using a conventional injection molding process. Exemplary plastics include epoxy novolac resin, silicone, phenylsilane and thermoset plastics. Alternately the base 56 can comprise ceramic, or a glass filled resin.

In addition, although the test contacts 60 are shown as being contained on the base 56, the test contacts 60 can also be formed on a separate interconnect mounted to the base 56. U.S. Pat. No. 5,686,317, entitled "METHOD FOR FORMING AN INTERCONNECT HAVING A PENETRATION LIMITED CONTACT STRUCTURE FOR ESTABLISHING A TEMPORARY ELECTRICAL CONNECTION WITH A SEMICONDUCTOR DIE", and U.S. Pat. No. 5,592,736, entitled "FABRICATING AN INTERCONNECT FOR TESTING UPACKAGED SEMICONDUCTOR DICE HAVING RAISED BOND PADS", both of which are incorporated herein by reference, describe methods for fabricating interconnects that can be used with the test carrier 50.

As shown in FIGS. 5A and 5B, the force applying mechanism 58 includes a clamp member 66 which attaches to the base 56, and a plurality of biasing members 68 for pressing the components 52 against the test contacts 60. The clamp member 66 includes tabs 70 for engaging mating slots (not shown) on the base 56 to secure the clamp member 66 to the base 56. In the illustrative embodiment, the biasing members 68 comprise elastomeric blocks formed of a polymer material such as silicone, butyl rubber, flourosilicone, or polyimide. Alternately the biasing members 68 can comprise steel leaf springs.

Figure 6A:
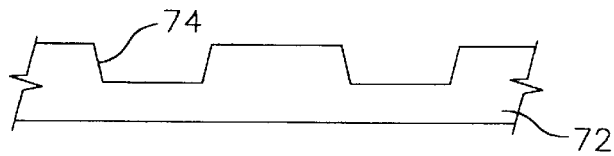
FIGS. 6A–6F are schematic cross sectional views illustrating process steps in a method for fabricating the test carrier of FIGS. 5A–5C.

Referring to FIGS. 6A–6F, steps in a method for fabricating the test contacts 60, conductive vias 20E and contact pins 62 on the base 56 are illustrated. Initially, as shown in FIG. 6A, a base substrate 72 is provided. With the base substrate 72 comprising plastic a molding process can be used to form the base 56 with a required geometry and external features.

As also shown in FIG. 6A, recesses 74 are formed in the base substrate 72. The recesses 74 can be etched, laser machined, or molded. For example, the recesses 74 can be etched by forming a mask (not shown) on the substrate 72, such as a photopatterned resist mask, and then etching through openings in the mask, using a wet or dry etchant. Alternately, the recesses 74 can be laser machined using a laser machining apparatus as previously described. In this case the laser machining apparatus can be controlled to form the recess with a required shape and depth into the substrate 72. As another alternative, the recesses 74 can be formed during injection molding of the base 56.

A size and shape of the recesses 74 corresponds to a size and shape of the external contacts 62 (FIG. 5A) on the semiconductor components 52 (FIG. 5A). Specifically, the recesses 74 are sized and shaped to retain and electrically engage the external contacts 62 (FIG. 5A). A representative diameter, or width, of the recesses 74 can be from 2 mils to 50 mils or more. This diameter can be less than a diameter of the external contacts 62 so that only portions of the external contacts 62 will be contacted. A representative depth for the recesses 74 can be from 0.25 mils to 25 mils or greater. Again this depth can be less than a height of the external contacts 62, so that only portions of the external contacts will be contacted. A pitch or spacing of the recesses 74 will exactly match a pitch or spacing of the external contacts 62. A representative pitch or spacing between the recesses 74 can be from about 6 mils to 50 mils or greater.

Figure 6B:
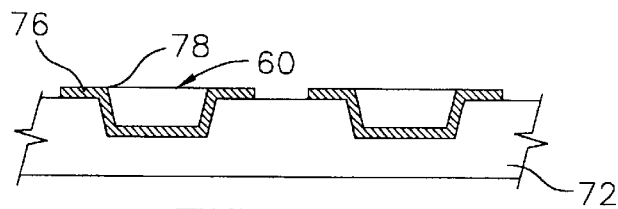

Referring to FIG. 6B, following formation of the recesses 74, conductive layers 76 are formed within the recesses 74 to complete the test contacts 60. Peripheral edges 78 of the conductive layers 76 are adapted to penetrate native oxide layers on the external contacts 54 (FIG. 5A) to contact the underlying metal. The conductive layers 76 can be formed as a layer of a highly conductive metal such as aluminum, titanium, nickel, iridium, copper, gold, tungsten, silver, platinum, palladium, tantalum, molybdenum or alloys of these metals. Rather than being a single layer of metal, the conductive layers 76 can be formed as multi-layered stacks of metals (e.g., bonding layer/barrier layer).

The conductive layers 76 can be formed using a metallization process (e.g., deposition, photopatterning, etching). An exemplary metallization process is disclosed in U.S. Pat. No. 5,607,818, incorporated herein by reference. The conductive layers 76 can also be formed using a plating process, such as electrolytic deposition, or electroless deposition. A representative thickness of the conductive layers 76 is from 600 Å to 20000 Å.

Figure 6C:
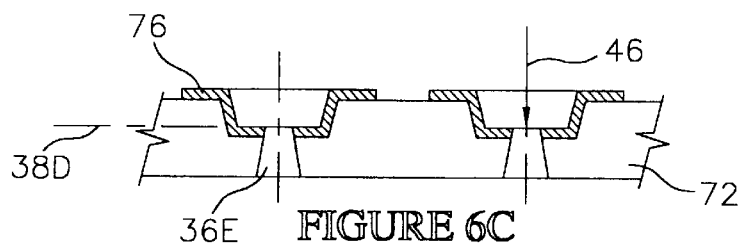

Referring to FIG. 6C, following formation of the conductive layers 76, laser machined openings 36E are formed through the conductive layers 76 and through the substrate 72. The laser machined openings 36E can be formed substantially as previously described using focused laser beam 46. A focal plane 38D of the laser beam 46 can be located approximately at the bottom of the recesses 74.

Figure 6D:
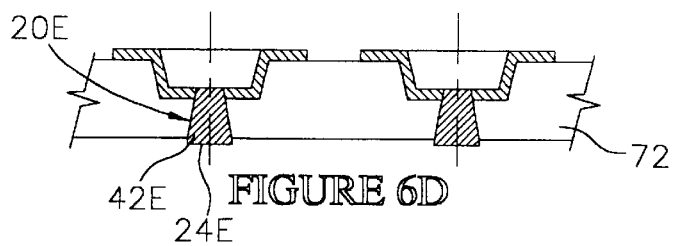

Referring to FIG. 6D, following formation of the laser machined openings 36E, a conductive material 42E can be deposited therein to form the conductive vias 42E. The conductive material 42E can comprise a metal or a conductive polymer as previously described. In addition, contacts 24E can be formed on the conductive vias 42E as previously described.

Figure 6E:
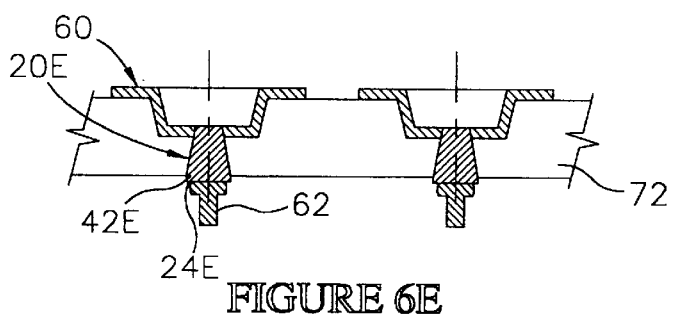

Referring to FIG. 6E, following formation of the conductive vias 42E, the contacts pins 62 are formed on the contacts 24E. Formation of the contact pins 62 can be performed in accordance with U.S. Pat. No. 5,495,667, entitled "METHOD FOR FORMING CONTACT PINS FOR SEMICONDUCTOR DICE AND INTERCONNECTS", which is incorporated herein by reference. Briefly, this method forms the contact pins 62 using a wire bonding process, or alternately a welding process, in which metal wires are bonded to the contacts 24E and then severed. A conventional wire bonding apparatus can be used to bond the metal wires to the contacts 24E and to sever the bonded wires to form the contacts pins 62.

Figure 6F:
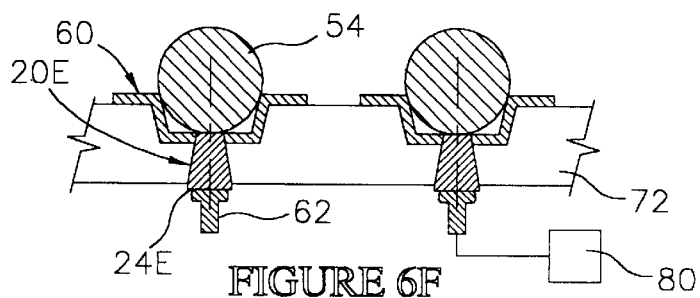

As shown in FIG. 6F, the completed test contacts 60 are adapted to electrically engage the external contacts 54 on the components 52 (FIG. 5E). In addition, the conductive vias 20E electrically connect the test contacts 60 to the contacts pins 62. The contact pins 62 are adapted to electrically engage a test apparatus 80, such as a burn-in board.

Referring to FIGS. 7 and 8A–8B, an interconnect 82 constructed in accordance with the invention is shown. The interconnect 82 functions in the manner of a wafer probe card to test semiconductor dice 94 (FIG. 8B) contained on a wafer 86 (FIG. 8A). FIG. 8A shows a wafer test system 84 (FIG. 8A) constructed using the interconnect 82.

As shown in FIG. 7, the interconnect 82 includes a plurality of die test sites 88. Each die test site 88 includes a plurality of compliant contacts 90 adapted to make temporary electrical connections with bond pads 92 (FIG. 8B) on the dice 94. For simplicity only two compliant contacts 90 per die test site 88 are illustrated in FIG. 7. However, in actual practice each die test site 88 will contain enough compliant contacts 90 to simultaneously contact all of the bond pads 92 on a die. In addition, the interconnect 82 can include enough die test sites 88 to test multiple dice 94 at the same time up to all of the dice contained on the wafer 86. Alternately, stepping techniques can be used to step the interconnect 82 to test all of the dice 94 contained on the wafer 86.

As shown in FIG. 8B, the interconnect 82 includes a substrate 95 in which a plurality of conductive vias 20F are formed substantially as previously described. The conductive vias 20F include contacts 24F on which the compliant contacts 90 are bonded. The compliant contacts 90 can be formed substantially as previously described for contact pins 62 (FIG. 5C). However, during bonding of the compliant contacts 90 to the contacts 24F, a wire is heated, and shaped to provide a compliant structure, such as a spring segment. Previously incorporated U.S. Pat. No. 5,495,667 discloses a method for forming the compliant contacts 90.

In addition to contacts 24F, the conductive vias 20F include contacts 22F. The contacts 22F are adapted to electrically engage spring loaded electrical connectors 98 associated with the test system 84 (FIG. 8A). The conductive vias 20F thus provide straight line electrical paths through the interconnect 82 from the compliant contacts 90 to the spring loaded electrical connectors 98.

As shown in FIG. 8A, in addition to the interconnect 82, the test system 80 also includes a wafer handler 100, and a tester 102 having test circuitry 104 for applying and analyzing test signals. The wafer handler 100 interfaces with a test head 106 wherein the interconnect 82 is mounted. In addition, the wafer handler 100 includes a wafer chuck 108 configured to move in X and Y directions to align the wafer 86 with the interconnect 82, and in the Z direction to move the wafer 86 into contact with the interconnect 82. The wafer handler 100 can also include an optical or mechanical alignment system (not shown) for aligning the wafer 86 to the interconnect 82. One suitable wafer handler 100 is manufactured by Electroglass and is designated a Model 4080.

The test system 84 also includes a prober interface board 110 for routing test signals from the tester 102 to the test head 106 and to the interconnect 82. The prober interface board 110 can be mounted to the test head 106. In addition, the prober interface board 110 can be in electrical communication with the tester pin electronics 112 in the test head 106. Separate electrical paths 114 are provided from the test circuitry 104 in the tester 102 to the tester pin electronics 112, and to the prober interface board 110. In addition, the prober interface board 110 includes separate electrical paths 114 to the interconnect 82.

As shown in FIG. 8A, the test system 84 also includes a probe card substrate 118 for mounting the interconnect 82, and a force applying mechanism 116 for biasing the interconnect 82 against the wafer 86. The probe card substrate 118 preferably comprises an electrically insulating material such as a glass filled resin (e.g., FR-4), a ceramic or plastic. In addition, the probe card substrate 118 includes an opening 120 wherein the force applying mechanism 116 is mounted.

The probe card substrate 118 can be attached to a probe card fixture 122 mounted within the test head 106. Threaded fasteners 124 can be used to removably attach the probe card substrate 118 to the probe card fixture 122. If desired, the probe card substrate 118 can be a conventional probe card having the middle portion removed to form the opening 120. The probe card fixture 122 can also be a conventional component. Conventional probe cards and probe card fixtures are available from Packard Hughes Interconnect, Los Angeles, Calif., and Wentworth Laboratories, Sunnyvale, Calif.

The force applying mechanism 116 includes a base 126 which attaches to the probe card substrate 118. In addition, the force applying mechanism 116 includes the spring loaded electrical connectors 98 mounted to a pin mounting plate 128 attached to the base 126. The electrical connectors 98 physically and electrically engage the pads contacts 22F (FIG. 8B) on the interconnect 82. The electrical connectors 98 can be commercially available spring loaded electrical connectors, such as "POGO PINS" manufactured by Pogo Industries of Kansas City, Kans. Other suitable spring loaded electrical connectors include "DURASEAL" connectors manufactured by IDI, Kansas City, Kans.

The interconnect 82 is slidably mounted to a two piece interconnect support plate 130 that attaches to the probe card substrate 118 with threaded fasteners 124. In addition, spring biased threaded fasteners 132 allow a planarity of the interconnect support plate 130 to be adjusted.

Further details of the wafer test system 84 are described in U.S. patent application Ser. No. 09/001,409, entitled "FORCE APPLYING PROBE CARD AND TEST SYSTEM FOR SEMICONDUCTOR WAFERS", which is incorporated herein by reference.

Thus the invention provides an improved method for fabricating semiconductor components using laser machined vias. Also provided are improved components including packages, test carriers and interconnects.

Although the invention has been described with reference to certain preferred embodiments, as will be apparent to those skilled in the art, certain changes and modifications can be made without departing from the scope of the invention as defined by the following claims.

We claim:

1. A method for fabricating a semiconductor component comprising:

providing a substrate comprising a first surface and a second surface;

laser machining an opening in the substrate from the first surface to the second surface using a laser beam;

selecting a focal point of the laser beam to form the opening with at least one enlarged end portion; and depositing a conductive material through the end portion into the opening to form a conductive via.

2. The method of claim 1 further comprising forming a contact on the enlarged end portion.

3. The method of claim 1 wherein the focal point is between the first surface and the second surface and the opening has an hour glass shape.

4. The method of claim 1 wherein the focal point is proximate the first surface and the opening has a diverging shape.

5. The method of claim 1 wherein the focal point is proximate to the second surface and the opening has a converging shape.

6. A method for fabricating a semiconductor component comprising:

providing a substrate comprising a first surface and a second surface;

laser machining an opening in the substrate from the first surface to the second surface using a laser beam;

selecting a focal point of the laser beam to form the opening with at least one enlarged end portion;

depositing a conductive material into the opening to form a conductive via; and forming a contact on the enlarged end portion.

7. The method of claim 6 wherein the substrate comprises silicon.

8. The method of claim 6 further comprising forming an insulating layer within the opening prior to the depositing step.

9. The method of claim 6 wherein the substrate comprises silicon and an insulating layer is formed in the opening prior to the depositing step.

10. A method for fabricating a semiconductor component comprising:

providing a substrate;

laser machining an opening in the substrate using a laser beam;

selecting a focal point of the laser beam to form the opening with a sidewall;

depositing a layer of a conductive material on the sidewall to form a conductive via;

forming a contact on the substrate comprising a peripheral ridge formed by the layer and configured to retain a ball contact; and bonding the ball contact to the contact.

11. The method of claim 10 wherein the focal point is proximate to a mid point of the substrate and the opening has an hour glass shape with enlarged end portions.

12. The method of claim 10 wherein the focal point is proximate an exit point of the laser beam from the substrate and the opening has an enlarged end portion wherein the contact is formed.

13. The method of claim 10 wherein the component comprises an element selected from the group consisting of packages, interconnects and test carriers.

14. A method for fabricating a semiconductor component comprising:

providing a substrate;

laser machining an opening in the substrate using a laser beam;

selecting a focal point of the laser beam to form the opening with at least one enlarged end portion;

depositing a conductive polymer through the enlarged end portion into the opening to form a conductive via;

placing a contact ball on the conductive polymer; and curing the conductive polymer.

15. The method of claim 14 wherein the contact ball forms a concave depression in the conductive polymer.

16. A method for fabricating a semiconductor component comprising:

providing a silicon substrate comprising a first surface and a second surface;

laser machining an opening in the substrate from the first surface to the second surface using a laser beam;

selecting a focal point of the laser beam to form the opening with a desired geometry;

forming an insulating layer in the opening;

depositing a conductive material into the opening to form a conductive via;

forming a first contact on the first surface in electrical communication with the conductive via; and forming a second contact on the second surface in electrical communication with the conductive via.

17. The method of claim 16 wherein the first contact comprises a conductive pocket and the second contact comprises a wire bonded to the conductive material.

18. The method of claim 16 wherein the second contact comprises a compliant wire bonded to the conductive material.

19. A method for fabricating a semiconductor component comprising:

providing a semiconductor die comprising a bond pad;

providing a substrate comprising a first surface and a second surface;

laser machining an opening in substrate from the first surface to the second surface using a laser beam;

selecting a focal point of the laser beam to form the opening with a desired geometry;

depositing a conductive material into the opening to form a conductive via comprising a first contact and a second contact;

bonding the bond pad to the first contact; and bonding a contact ball to the second contact.

20. The method of claim 19 wherein the opening has enlarged end portions wherein the first contact and the second contact are formed.

21. The method of claim 19 wherein the conductive material comprises a conductive polymer and bonding the contact ball comprises curing the conductive polymer with the contact ball pressed against the conductive polymer.

22. The method of claim 19 wherein the opening has at least one enlarged end portion through which the conductive material is deposited.

23. A method for fabricating a semiconductor component comprising:

providing a substrate comprising a first surface and a second surface;

laser machining an opening in the substrate from the first surface to the second surface using a laser beam;

selecting a focal point of the laser beam to form the opening with a desired geometry;

depositing a conductive material into the opening to form a conductive via;

forming a first contact on the first surface configured to electrically engage an external contact on a semiconductor die or package; and forming a second contact on the second surface configured to electrically engage a test apparatus.

24. The method of claim 23 wherein the first contact comprises a conductive pocket and the external contact comprises a metal ball.

25. The method of claim 23 wherein the substrate comprises silicon and an insulating layer is formed in the opening prior to the depositing step.

26. A method for fabricating a semiconductor component comprising:

providing a substrate comprising a first surface and a second surface;

laser machining an opening in the substrate from the first surface to the second surface using a laser beam;

selecting a focal point of the laser beam to form the opening with an enlarged end portion;

depositing a conductive material into the opening to form a conductive via;

forming a contact on the enlarged end portion; and bonding a wire to the contact configured to electrically engage a semiconductor die.

27. The method of claim 26 further comprising shaping the wire with a spring segment.

28. The method of claim 26 wherein the die is contained on a semiconductor wafer.

* * * * *